US012648369B2

(12) United States Patent
Cai et al.

(10) Patent No.: US 12,648,369 B2
(45) Date of Patent: Jun. 2, 2026

(54) NON-VOLATILE PROGRAMMABLE DEVICES WITH FILAMENT CONFINEMENT

(71) Applicant: GlobalFoundries Singapore Pte. Ltd., Singapore (SG)

(72) Inventors: Xinshu Cai, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 477 days.

(21) Appl. No.: 18/195,414

(22) Filed: May 10, 2023

(65) Prior Publication Data

US 2024/0381794 A1     Nov. 14, 2024

(51) Int. Cl.
H10N 70/00       (2023.01)
H10B 63/00       (2023.01)
(52) U.S. Cl.
CPC ........... H10N 70/821 (2023.02); H10B 63/30 (2023.02); H10N 70/011 (2023.02); H10N 70/841 (2023.02); H10N 70/883 (2023.02)
(58) Field of Classification Search
CPC .. H10N 70/821; H10N 70/011; H10N 70/841; H10N 70/883; H10N 70/20; H10N 70/826; H10B 63/30
See application file for complete search history.

(56) References Cited

U.S. PATENT DOCUMENTS

| | | | |
|---|---|---|---|
| 7,805,687 B2 | 9/2010 | Hu et al. | |
| 9,935,113 B2 | 4/2018 | Wu et al. | |
| 11,502,250 B2 | 11/2022 | Loy et al. | |
| 11,837,603 B2 * | 12/2023 | Lai | H10D 62/116 |
| 2007/0257331 A1 | 11/2007 | Kurjanowicz et al. | |
| 2008/0070356 A1 * | 3/2008 | Brown | H10D 30/0273 |
| | | | 438/303 |
| 2013/0049108 A1 * | 2/2013 | Chen | H10D 30/663 |
| | | | 438/270 |
| 2015/0044837 A1 * | 2/2015 | Ng | H10D 30/0297 |
| | | | 438/270 |
| 2017/0338309 A1 * | 11/2017 | Liu | H10D 64/117 |
| 2018/0040734 A1 * | 2/2018 | Chang | H10D 30/024 |

* cited by examiner

*Primary Examiner* — Omar F Mojaddedi
(74) *Attorney, Agent, or Firm* — Thompson Hine LLP

(57) ABSTRACT

Structures for a non-volatile programmable device and methods of forming a structure for a non-volatile programmable device. The structure comprises a first electrode including a corner and a sidewall that extends to the corner, a first dielectric layer adjacent to the first sidewall, a second dielectric layer adjacent to the first dielectric layer, and a second electrode including a portion inside a recess between the first dielectric layer and the second dielectric layer. The portion of the second electrode is disposed adjacent to the corner of the first electrode.

19 Claims, 6 Drawing Sheets

NON-VOLATILE PROGRAMMABLE DEVICES WITH FILAMENT CONFINEMENT

BACKGROUND

This disclosure relates to integrated circuits and semiconductor device fabrication and, more specifically, to structures for a non-volatile programmable device and methods of forming a structure for a non-volatile programmable device.

Non-volatile programmable devices are utilized in various electronic products, such as cellular telephones. One-Time-Programmable (OTP) memory and Multiple-Time-Programmable (MTP) memory are common types of non-volatile programmable devices. A difference between these common types of non-volatile programmable devices is that a One-Time-Programmable device that can only be programmed a single time, whereas a Multiple-Time-Programmable device is capable of being repeatedly programmed and erased. A general disadvantage of non-volatile programmable devices is that their programming efficiency scales with device size, which may result in a relatively-large device size in order to provide satisfactory programming efficiency.

Improved structures for a non-volatile programmable device and methods of forming a structure for a non-volatile programmable device are needed.

SUMMARY

According to an embodiment of the invention, a structure for a non-volatile programmable device is provided. The structure comprises a first electrode including a corner and a sidewall that extends to the corner, a first dielectric layer adjacent to the first sidewall, a second dielectric layer adjacent to the first dielectric layer, and a second electrode including a portion inside a recess between the first dielectric layer and the second dielectric layer. The portion of the second electrode is disposed adjacent to the corner of the first electrode.

According to another embodiment of the invention, a method of forming a structure for a non-volatile programmable device is provided. The method comprises forming a first electrode that includes a corner and a sidewall that extends to the corner, forming a first dielectric layer adjacent to the sidewall, and forming a second dielectric layer adjacent to the first dielectric layer. The method further comprises recessing the first dielectric layer relative to the second dielectric layer to define a recess adjacent to the corner of the first electrode, and forming a second electrode including a portion inside the recess.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
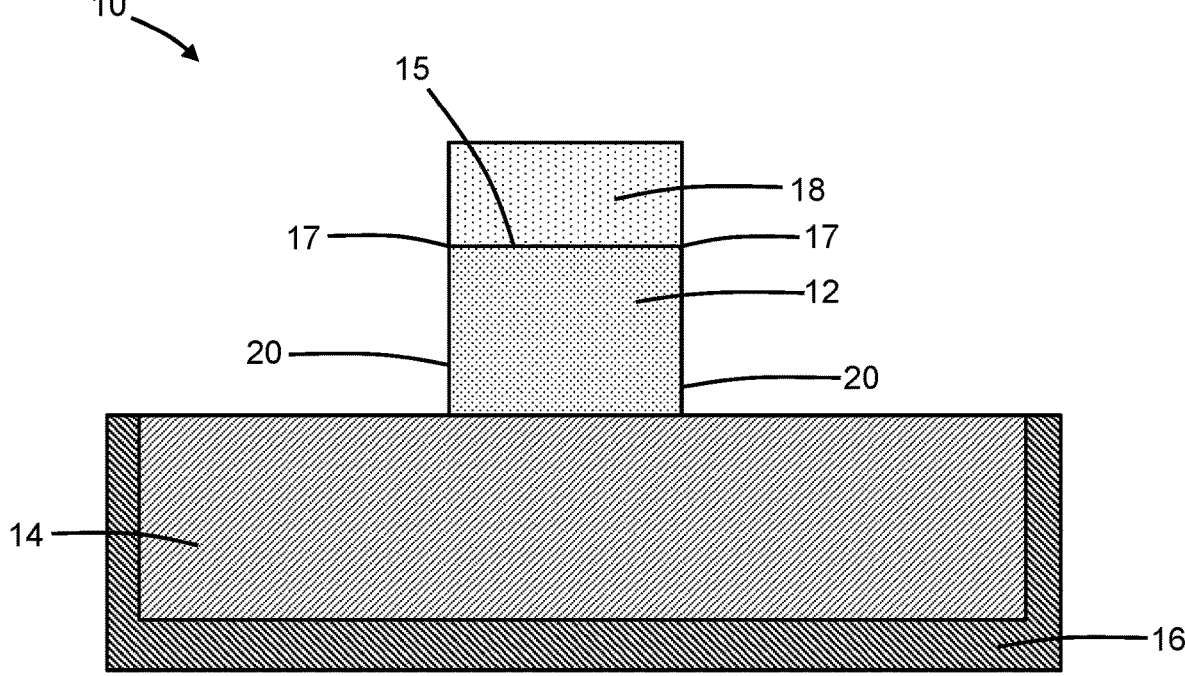
FIG. 1 is a cross-sectional view of a structure for a non-volatile programmable device at an initial fabrication stage in accordance with embodiments of the invention.

With reference to FIG. 1 and in accordance with embodiments of the invention, a structure 10 for a non-volatile programmable device includes an electrode 12 that is formed on a dielectric layer 14. The dielectric layer 14 is disposed on a substrate 16. In an embodiment, the dielectric layer 14 may be comprised of a dielectric material, such as silicon dioxide. In an embodiment, the substrate 16 may be comprised of a monocrystalline or single-crystal semiconductor material, such as single-crystal silicon. In an embodiment, the dielectric layer 14 may be a shallow trench isolation region that is formed in a trench patterned in the substrate 16.

The electrode 12 may be included in a layer stack that further includes a hardmask layer 18. The electrode 12 may be comprised of a conductive material, such as doped polysilicon or a metal, and the hardmask layer 18 may be comprised of a dielectric material, such as silicon nitride. The materials of the electrode 12 and the hardmask layer 18 may be deposited, the material of the hardmask layer 18 may be patterned by lithography and etching processes, and then the material of the electrode 12 may be patterned by an etching process using the patterned hardmask layer 18 as an etch mask.

The bottom surface of the hardmask layer 18 and the top surface of the electrode 12 may adjoin along an interface 15. The electrode 12 may have opposite sidewalls 20 are joined by the top surface of the electrode 12 and a bottom surface adjoining the dielectric layer 14. The electrode 12 may include upper corners 17 at the intersections between the sidewalls 20 and the top surface of the electrode 12, as well as lower corners at the intersections between the sidewalls 20 and the bottom surface of the electrode 12. The sidewalls 20 of the electrode 12 may extend from the dielectric layer 14 to the upper corners 17 of the electrode 12. In an embodiment, the sidewalls 20 of the electrode 12 may extend in a vertical direction from the dielectric layer 14 to the upper corners 17 of the electrode 12.

Figure 2:
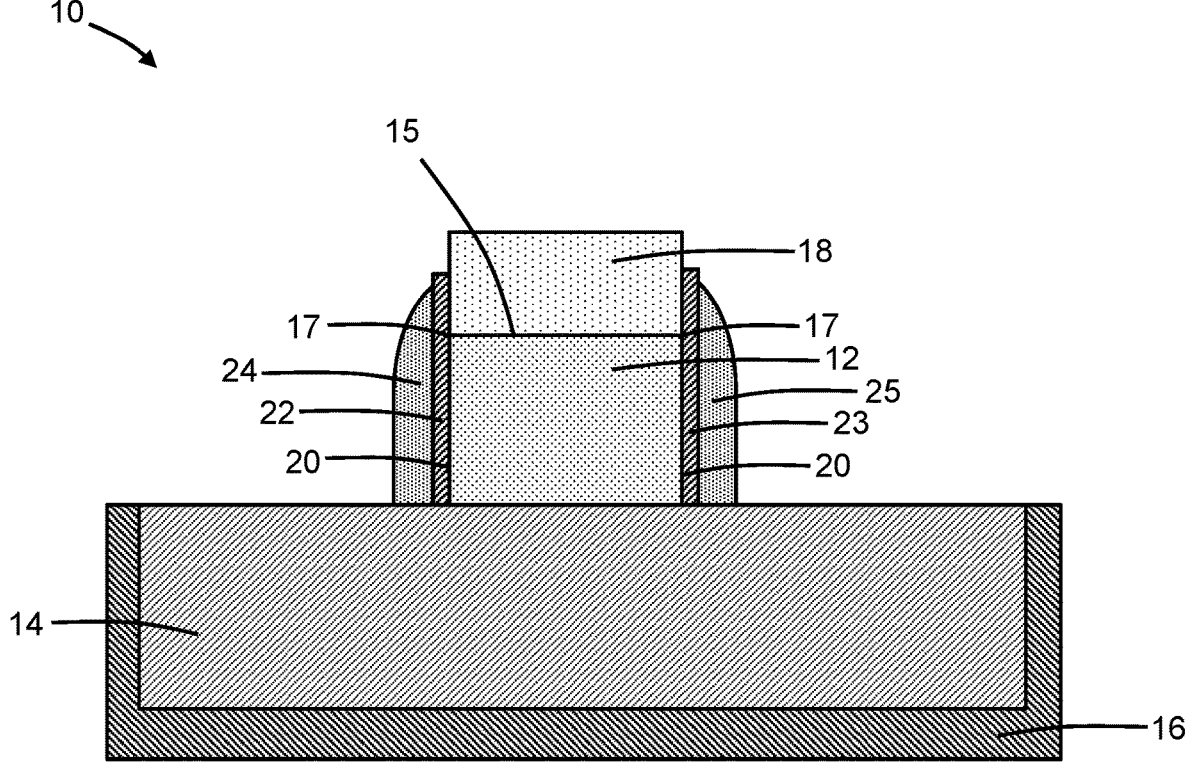
FIG. 2 is a cross-sectional view of the structure at a fabrication stage subsequent to FIG. 1.

With reference to FIG. 2 in which like reference numerals refer to like features in FIG. 1 and at a subsequent fabrication stage, dielectric layers 22, 23 and dielectric layers 24, 25 may be formed adjacent to the opposite sidewalls 20 of the electrode 12. The dielectric layer 22 is disposed between the dielectric layer 24 and one of the sidewalls 20 of the electrode 12, and the dielectric layer 23 is disposed between the dielectric layer 25 and the other of the sidewalls 20 of the electrode 12.

The dielectric layers 22, 23 may be formed as sidewall spacers by depositing a conformal layer comprised of a dielectric material, such as silicon dioxide, and etching the conformal layer with a reactive ion etching process. The dielectric layers 24, 25 may be formed as sidewall spacers by depositing a conformal layer comprised of a dielectric material, such as silicon nitride, and etching the conformal layer with a reactive ion etching process. In an embodiment, the dielectric layers 22, 23 may have a width in a range of one (1) nanometer to ten (10) nanometers.

In an alternative embodiment, the dielectric layers 22, 23 may be comprised of a high-k dielectric material that is characterized by a dielectric constant greater than the dielectric constant of silicon dioxide. For example, the dielectric layers 22, 23 may be comprised of a dielectric material, such as hafnium oxide or tantalum oxide, having a dielectric constant (i.e., permittivity) greater than or equal to about four (4). The inclusion of a high-k dielectric material may enable multiple-time programming of the non-volatile programmable device embodied in the structure 10.

Figure 3:
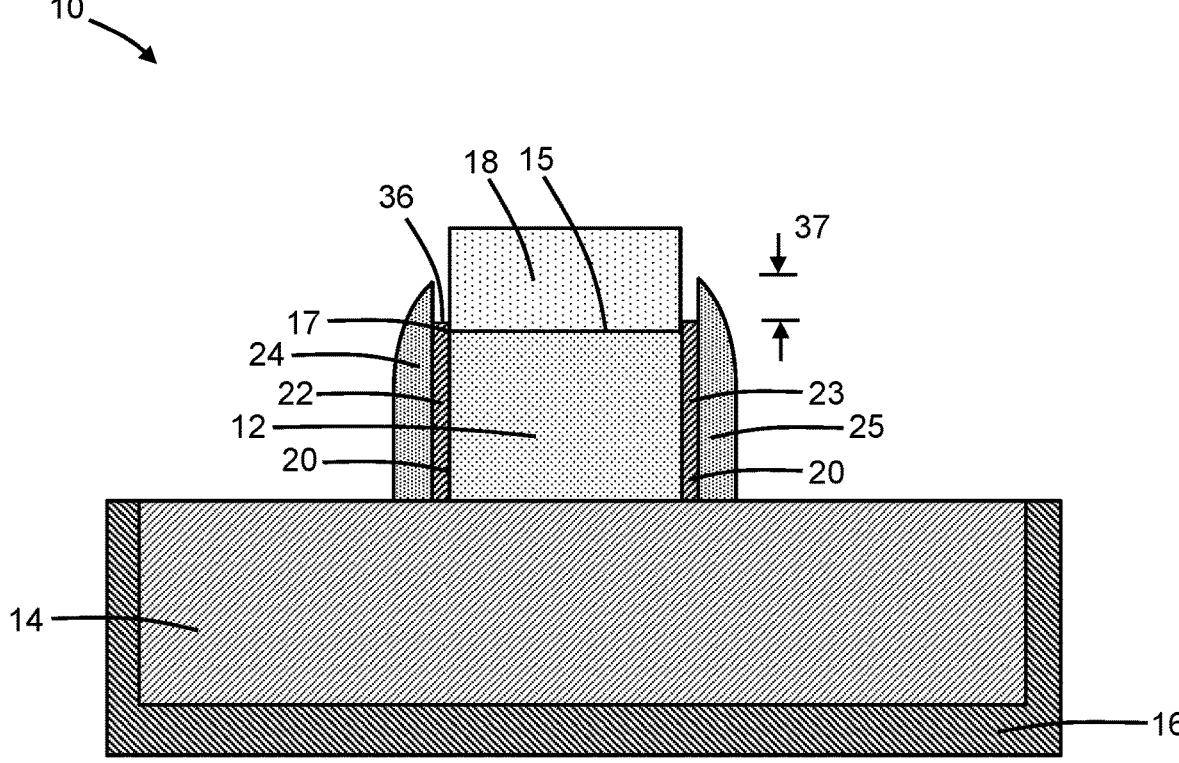
FIG. 3 is a cross-sectional view of the structure at a fabrication stage subsequent to FIG. 2.

With reference to FIG. 3 in which like reference numerals refer to like features in FIG. 2 and at a subsequent fabrication stage, the dielectric layers 22, 23 may be recessed relative to the dielectric layer 24, 25 and the hardmask layer 18. After recessing the dielectric layers 22, 23, the dielectric layer 24 includes an upper portion that is separated by a recess 37 from a portion of the hardmask layer 18 at an adjacent upper corner 17 of the electrode 12, and the dielectric layer 25 includes an upper portion that is separated by a recess 37 from a portion of the hardmask layer 18 at another adjacent upper corner 17 of the electrode 12. The upper portions of the dielectric layer 24 and the dielectric layer 25 are disposed above the upper corners 17 of the electrode 12 and above the interface 15. Each of the dielectric layers 24, 25 includes a lower portion that is disposed below the upper corners 17 of the electrode 12 and the interface 15.

Each of the recessed dielectric layers 22, 23 has a topmost surface 36 that is located at a maximum height above the dielectric layer 14. The topmost surfaces 36 of the dielectric layers 22, 23 are located between the interface 15 and the recesses 37. Each of the recessed dielectric layers 22, 23 includes an upper portion that is disposed between the upper corners 17 of the electrode 12 and the topmost surface 36, and a lower portion that is disposed between the upper corners 17 of the electrode 12 and the dielectric layer 14. The upper portions of the dielectric layers 24, 25 extend above the upper portions of the recessed dielectric layers 22, 23 such that the recesses 37 are defined as unfilled and open divots.

In an embodiment, the dielectric layers 22, 23 may be recessed relative to the dielectric layer 24, 25 and hardmask layer 18 by an etching process. In an embodiment, the dielectric material of the dielectric layers 22, 23 may be chosen to be etched and removed selective to the dielectric material constituting the dielectric layers 24, 25. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 4:
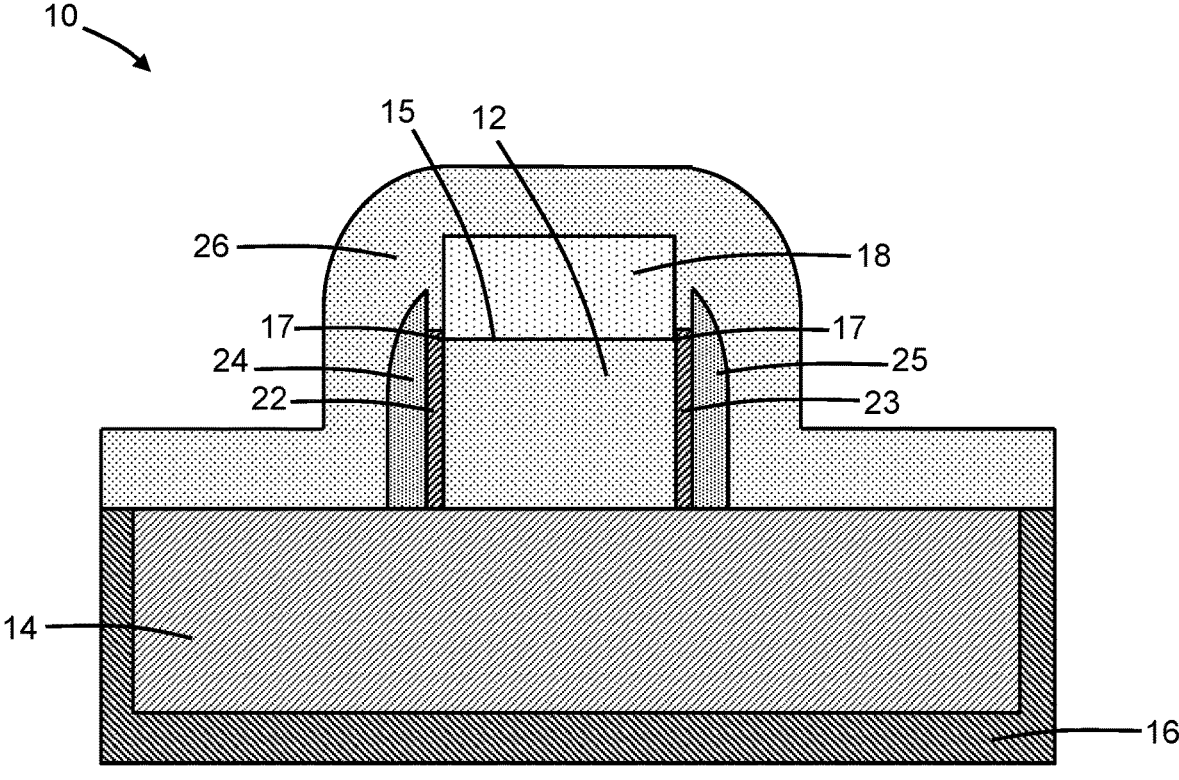
FIG. 4 is a cross-sectional view of the structure at a fabrication stage subsequent to FIG. 3.

With reference to FIG. 4 in which like reference numerals refer to like features in FIG. 3 and at a subsequent fabrication stage, a layer 26 comprised of a conductor, such as doped polysilicon, may be conformally deposited. In an embodiment, the layer 26 may have a uniform thickness that is dependent of the underlying topography. A portion of the layer 26 defines a tip that is disposed in the recess 37 between the hardmask layer 18 and the dielectric layer 24. Another portion of the layer 26 defines a tip that is disposed in the recess 37 between the hardmask layer 18 and the dielectric layer 25. In an embodiment, the different portions of the layer 26 may fill the recesses 37. The different portions of the layer 26 inside the recesses 37 are disposed adjacent to the upper corners 17 of the electrode 12 and above the topmost surfaces 36 of the dielectric layers 22, 23.

Figure 5:
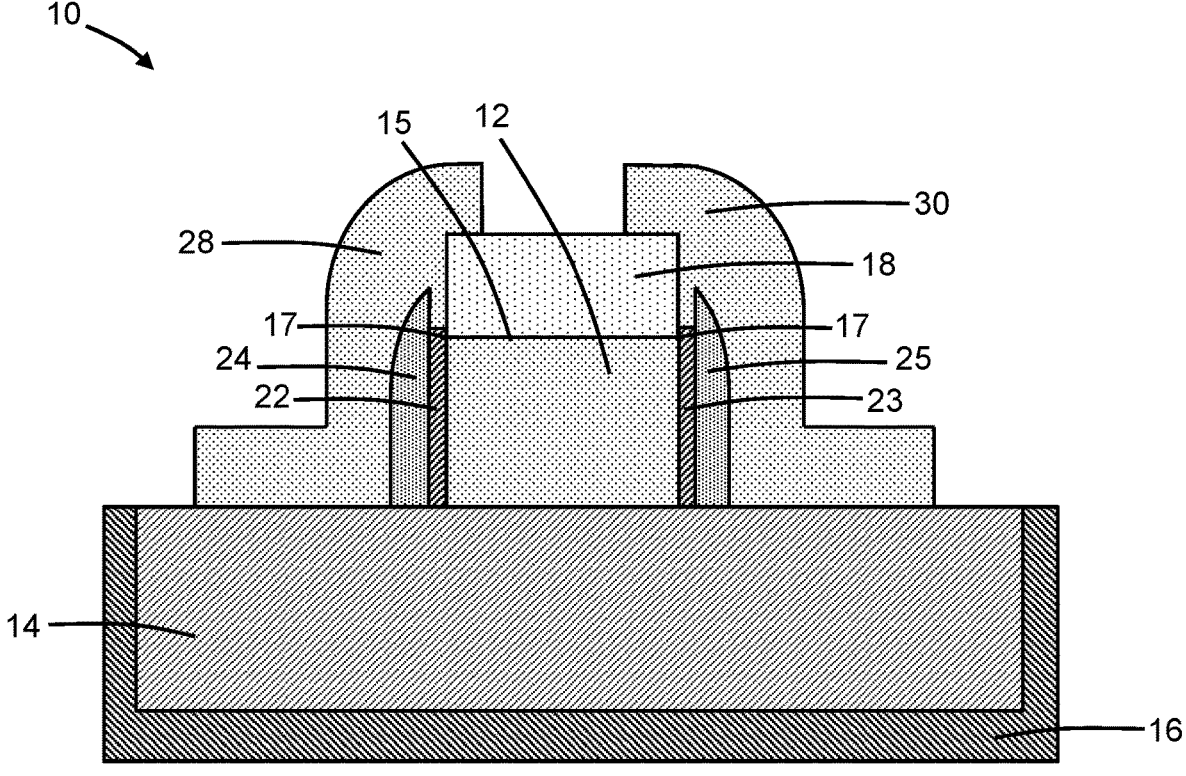
FIG. 5 is a cross-sectional view of the structure at a fabrication stage subsequent to FIG. 4.

With reference to FIG. 5 in which like reference numerals refer to like features in FIG. 4 and at a subsequent fabrication stage, an electrode 28 and an electrode 30 may be formed by patterning the layer 26 (FIG. 4) with lithography and etching processes. The electrode 28 includes a portion defined by the portion of layer 26 inside the recess 37 between the hardmask layer 18 and the dielectric layer 24. This portion of the electrode 28 is disposed adjacent to one of the upper corners 17 of the electrode 12 with a portion of the dielectric layer 22 disposed between the upper corner 17 of the electrode 12 and the portion of the electrode 28. The electrode 30 includes a portion defined by the portion of the layer 26 inside the recess 37 between the hardmask layer 18 and the dielectric layer 25. This portion of the electrode 30 is disposed adjacent to another of the upper corners 17 of the electrode 12 with a portion of the dielectric layer 23 disposed between the upper corner 17 of the electrode 12 and the portion of the electrode 30.

The portion of the electrode 28 in the recess 37 may adjoin the topmost surface 36 of the recessed dielectric layer 22. In addition to the portion in the recess 37, the electrode 28 also includes a portion that adjoins the hardmask layer 18 and a portion that adjoins the dielectric layer 24. The portion of the electrode 30 in the recess 37 may adjoin the topmost surface 36 of the recessed dielectric layer 23. In addition to the portion in the recess 37, the electrode 30 also includes a portion that adjoins the hardmask layer 18 and a portion that adjoins the dielectric layer 25. The portion of the electrode 28 adjoining the hardmask layer 18 is separated from portion of the electrode 30 adjoining the hardmask layer 18 by an open gap that is disposed over the electrode 12 and hardmask layer 18.

Figure 6:
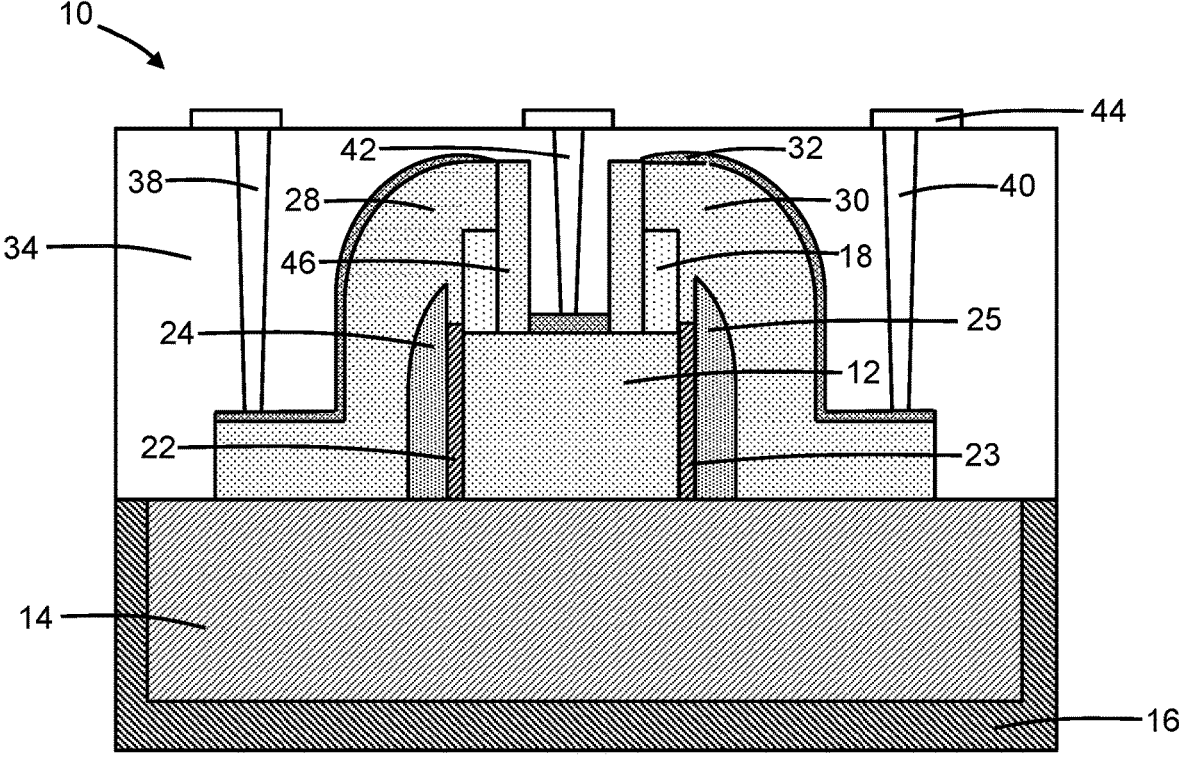
FIG. 6 is a cross-sectional view of the structure at a fabrication stage subsequent to FIG. 5.

With reference to FIG. 6 in which like reference numerals refer to like features in FIG. 5 and at a subsequent fabrication stage, middle-of-line processing and back-end-of-line processing follow, which includes formation of silicide, contacts, vias, and wiring for an interconnect structure coupled to the non-volatile programmable device. The interconnect structure includes silicide layers 32 formed on the electrode 12 and the electrodes 28, 30, a dielectric layer 34, a bit line contact 38 coupled to the electrode 28, a bit line contact 40 coupled to the electrode 30, and a program line contact 42 coupled to the electrode 12. The silicide layers 32 may be formed by a silicidation process and may be comprised of silicon and a metal, such as nickel. The dielectric layer 34 may be comprised of, for example, silicon dioxide, and the contacts 38, 40, 42 may be comprised of a metal, such as tungsten. The contacts 38, 40, 42 may be coupled to metal interconnects 44, which may be comprised of copper, disposed in a metallization level of the interconnect structure that is over the dielectric layer 34. The hardmask layer 18 may be removed beneath the gap between the portions of the electrodes 28, 30 adjoining the hardmask layer 18 to expose a portion of the top surface of the electrode 12, sidewall spacers 46 comprised of an electrical insulator may be formed in the space opened by the removal of the portion of the hardmask layer 18, and a silicide layer 32 may be formed on the exposed portion of the top surface of the electrode 12.

The structure 10 for the non-volatile programmable device includes a bit associated with the electrode 12 and the electrode 28. To program this particular bit, a combination of a programming voltage applied to the electrode 12 and ground applied to the electrode 28 may cause the dielectric layer 22 to experience dielectric breakdown adjacent to the adjacent upper corner 17 of the electrode 12. After programming, the dielectric layer 22 may include one or more conductive filaments that function to provide a conductive path across the dielectric layer 22 from the upper corner 17 of the electrode 12 to the portion of the electrode 28 inside the recess 37. The portion of the electrode 28 arranged inside the recess 37 adjacent to the upper corner 17 of the electrode 12 enables a confined breakdown path in the dielectric layer 22 between the electrode 28 and the electrode 12.

The structure 10 for the non-volatile programmable device includes a bit associated with the electrode 12 and the electrode 30. To program this particular bit, a combination of a programming voltage applied to the electrode 12 and ground applied to the electrode 30 may cause the dielectric layer 23 to experience dielectric breakdown adjacent to the adjacent upper corner 17 of the electrode 12. After programming, the dielectric layer 23 may include one or more conductive filaments that function to provide a conductive path across the dielectric layer 23 from the upper corner 17 of the electrode 12 to the portion of the electrode 30 inside the recess 37. The portion of the electrode 30 arranged inside the recess 37 adjacent to the upper corner 17 of the electrode 12 enables a confined breakdown path in the dielectric layer 23 between the electrode 30 and the electrode 12.

In an embodiment in which the dielectric layers 22, 23 are comprised of a high-k dielectric material, the bits of the structure 10 for the non-volatile programmable device may be programmed and erased multiple times. After programming, the dielectric layer 22 may include one or more conductive filaments that function to reduce the electric resistance between the electrode 12 and the electrode 28 and/or between the electrode 12 and the electrode 30, and thereby provide a low-resistance state. The programming of each bit may be individually erased or reset by applying a combination of voltages to the electrode 12 and either the electrode 28 or the electrode 30 that eliminates the one or more conductive filaments and thereby restores the initial high-resistance state.

The structure 10 for the non-volatile programmable device is compact and features a pair of bits respectively associated with the different electrodes 28, 30. The confined breakdown paths may improve the programming efficiency and may lower the power needed to program the bits. The post-programming distribution of read currents may be tightened by the confined breakdown paths associated with the different bits.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a non-volatile programmable device, the structure comprising:
    a first electrode including a first corner and a first sidewall that extends to the first corner;
    a first dielectric layer adjacent to the first sidewall;
    a second dielectric layer adjacent to the first dielectric layer; and
    a second electrode including a first portion inside a recess between the first dielectric layer and the second dielectric layer, the first portion of the second electrode disposed adjacent to the first corner of the first electrode,
    wherein the first dielectric layer includes a first portion above the first corner and a second portion below the first corner, the second dielectric layer includes a first portion above the first corner and a second portion below the first corner, the first portion of the second dielectric layer extends above the first portion of the first dielectric layer, and the first portion of the first dielectric layer is arranged between the first portion of the second electrode and the first corner of the first electrode.

2. The structure of claim 1 wherein the first dielectric layer is positioned between the second dielectric layer and the first sidewall.

3. The structure of claim 2 wherein the first portion of the second electrode is disposed between the first portion of the second dielectric layer and the first portion of the first dielectric layer.

4. The structure of claim 1 wherein the first dielectric layer includes a topmost surface, and the second dielectric layer extends above the topmost surface of the first dielectric layer to define the recess.

5. The structure of claim 4 wherein the first portion of the second electrode adjoins the topmost surface of the first dielectric layer.

6. The structure of claim 4 further comprising:

a hardmask layer on the first electrode, wherein the hardmask layer and the first electrode adjoin along an interface, and the first portion of the first dielectric layer is between the interface and the topmost surface.

7. The structure of claim 1 wherein the first electrode includes a second corner and a second sidewall, and further comprising:

a third dielectric layer adjacent to the second sidewall;

a fourth dielectric layer adjacent to the third dielectric layer; and a third electrode including a portion inside a recess between the third dielectric layer and the fourth dielectric layer, the portion of the third electrode disposed adjacent to the second corner of the first electrode.

8. The structure of claim 7 wherein the third dielectric layer includes a first portion above the second corner and a second portion below the second corner.

9. The structure of claim 7 further comprising:

a hardmask layer on the first electrode, wherein the hardmask layer and the first electrode adjoin along an interface, the first portion of the first dielectric layer is above the interface, the first portion of the second dielectric layer is above the interface, the third dielectric layer includes a portion above the interface, and the fourth dielectric layer includes a portion above the interface.

10. The structure of claim 1 further comprising:

a shallow trench isolation region, wherein the first electrode is disposed on the shallow trench isolation region.

11. The structure of claim 10 wherein the second electrode is disposed on the shallow trench isolation region.

12. The structure of claim 10 wherein the first dielectric layer is disposed on the shallow trench isolation region.

13. The structure of claim 10 wherein the second dielectric layer is disposed on the shallow trench isolation region.

14. The structure of claim 11 wherein the first sidewall of the first electrode extends from the shallow trench isolation region to the first corner of the first electrode.

15. The structure of claim 1 wherein the second electrode includes a second portion that adjoins the second dielectric layer.

16. The structure of claim 1 wherein the first dielectric layer comprises silicon dioxide.

17. The structure of claim 1 wherein the first dielectric layer comprises a high-k dielectric material.

18. The structure of claim 1 wherein the first electrode of the non-volatile programmable device is configured to receive a programming voltage while the second electrode of the non-volatile programmable device is at ground to form a conductive path across the first portion of the first dielectric layer between the first corner of the first electrode and the first portion of the second electrode.

19. The structure of claim 1 wherein the first corner of the first electrode is configured to enable a confined breakdown path in the first portion of the first dielectric layer between the first corner of the first electrode and the first portion of the second electrode.

\* \* \* \* \*